Aug. 4, 1964 M. M. KAUFMAN ETAL 3,143,660

STABILIZED NEGATIVE RESISTANCE DIODE CIRCUIT

Filed Aug. 29, 1960

INVENTORS
MELVIN M. KAUFMAN &
FREDERICK N. WEIGEL
BY
Carl V. Olson
ATTORNEY

United States Patent Office 3,143,660
Patented Aug. 4, 1964

1 2

3,143,660
STABILIZED NEGATIVE RESISTANCE DIODE CIRCUIT

Melvin M. Kaufman, Merchantville, and Frederick N. Weigel, Moorestown, N.J., assignors to Radio Corporation of America, a corporation of Delaware Filed Aug. 29, 1960, Ser. No. 52,682
8 Claims. (Cl. 307—88.5)

This invention relates to circuits including negative resistance elements, such as tunnel diodes, and more particularly to circuits which are stabilized to operate reliably while permitting relaxed tolerances on the initial values of, or subsequent changes in the values of, the bias supply voltage, circuit elements and the characteristics of the negative resistance element. The invention is useful, by way of example, in electronic computer and data systems.

A form of negative resistance element known as a tunnel diode has been described by H. S. Sommers, Jr., in the IRE Proc., vol. 47, July 1959, p. 1201. Tunnel diodes have a current-voltage characteristic including low voltage and high voltage positive resistance regions which are separated by a negative resistance region. The operating point of the tunnel diode may be very rapidly switched between the low voltage and high voltage positive resistance regions.

A tunnel diode pulse circuit may be biased with a direct current (D.C.) source to provide a quiescent operating point in the low voltage positive resistance region near the peak current point. A positive input pulse then causes the operating point to go over the peak and rapidly switch through the negative resistance region to the high voltage positive resistance region.

One of the most serious problems connected with the practical and commercial utilization of tunnel diode circuits has been the necessity of very accurately biasing the diode so that the quiescent operating point is near the current peak of the diode's characteristic curve. If the voltage is too low, a large input pulse is needed to insure switching by movement of the operating point over the peak, and the logic gain or "fan out" of the circuit is considerably reduced. On the other hand, if the bias voltage is too high, the circuit is unstable, and also the diode may be switched by noise. In order to achieve the desired optimum operation of tunnel diode pulse circuits, it has been necessary to specify D.C. bias sources which provide a voltage that is stable to ±1%, and to specify values of circuit elements and tunnel diode characteristics to within similar very small tolerances.

It is a general object of this invention to provide a negative resistance diode circuit which is stable and which operates reliably with large logic gain while permitting relatively large tolerances on the values of bias voltage, circuit elements and tunnel diode characteristics.

It is another object to provide an improved monostable tunnel diode pulse circuit.

In one aspect the invention comprises a circuit including a negative resistance element, such as a tunnel diode, to which a forward D.C. bias is applied through an impedance such as an inductor. Means are provided for applying an input signal across the tunnel diode, and for deriving an output signal from across the diode. The circuit may be a monostable circuit to which an input trigger pulse is applied to switch the tunnel diode and cause the generation of an output pulse. An alternating current (A.C.) bias is applied across the tunnel diode, in addition to the D.C. bias applied. The frequency of the A.C. bias source should be such that it has a half period of the same order of magnitude in time as the rise time of the tunnel diode. The tunnel diode circuit, when biased by both D.C. and A.C. sources, operates reliably even though the bias sources vary an amount such as ±10% from the optimum values.

These and other objects and aspects of the invention will be apparent from the following more detailed description taken in conjunction with the appended drawing, wherein.

Figure 1:
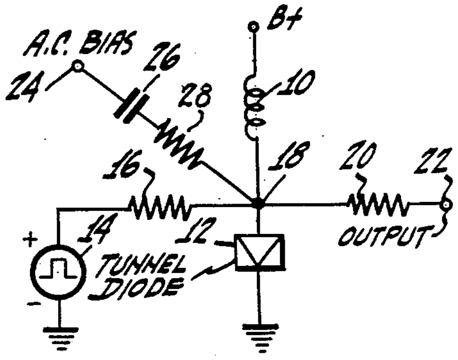
FIGURE 1 is a diagram of a tunnel diode circuit which is both D.C. biased and A.C. biased in accordance with the teachings of the invention.

Referring now in greater detail to FIGURE 1, the circuit shown includes an inductor 10 and a tunnel diode 12 connected in series between a B+ terminal and a point of reference potential such as ground. A source of D.C. bias, indicated as B+, is connected across the series circuit to quiescently forward bias the tunnel diode at a desired point on its current-voltage characteristic curve. An input signal pulse source 14 is coupled through a resistor 16 to the junction point 18 between the inductor 10 and the tunnel diode 12. An output signal pulse is coupled from the junction point 18 through resistor 20 to an output terminal 22. The portion of the circuit of FIGURE 1 which has thus far been described, when appropriately biased, constitutes a monostable circuit for the generation of an output pulse, like the pulse illustrated in FIGURE 6, when the circuit is triggered by an input pulse.

Figure 2:
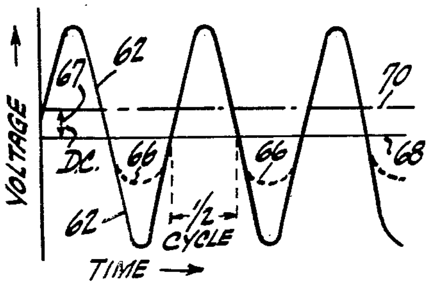
FIGURE 2 is a chart of the A.C. bias voltage waveform applied to the tunnel diode circuit in FIGURE 1.

The circuit of FIGURE 1 includes means for supplying an A.C. bias to the tunnel diode 12, in addition to the D.C. bias applied thereto. An A.C. bias source, as indicated by the legend, is connected across the series circuit including an A.C. bias terminal 24, a capacitor 26, a resistor 28, the junction point 18, the tunnel diode 12 and ground. The A.C. bias source connected to the terminal 24 may provide a sinusoidal A.C. signal (as shown in FIGURE 2) of 1.5 volts peak-to-peak, and the source should preferably have a frequency such that a half cycle of the A.C. bias wave has a time duration of the same order of magnitude as the rise time of the tunnel diode 12.

Figure 3:
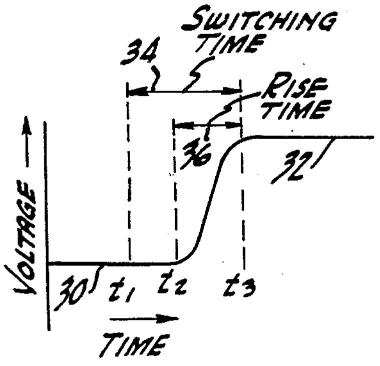
FIGURE 3 is a voltage-time chart illustrating the voltage change across a tunnel diode as it is switched from its low voltage state to its high voltage state.

The rise time characteristic of the tunnel diode is illustrated in FIGURE 3 where the voltage level 30 represents a low voltage state of the diode and the voltage level 32 represents a high voltage state of the diode. The diode is switched from the low voltage state to the high voltage state by the application of an input pulse beginning at the time $t_1$. The voltage across the diode starts to rise at a later time $t_2$, and the voltage reaches its maximum value 32 at the time $t_3$. The interval 34 from $t_1$ to $t_3$ is called the switching time, and the interval 36 from $t_2$ to $t_3$ is called the rise time of the diode. The rise time 36 of a tunnel diode may typically be 15 nanoseconds (millimicroseconds or $10^{-9}$ seconds). An A.C. bias source having a half cycle, or half period, of 15 nanoseconds corresponds with a frequency of about 13 megacycles. It has been found that the circuit of FIGURE 1 operates satisfactorily over a wide range of A.C. bias frequencies, but that optimum results are achieved when a half cycle of the A.C. bias wave approximately corresponds in time with the rise time of the tunnel diode.

Figure 4:
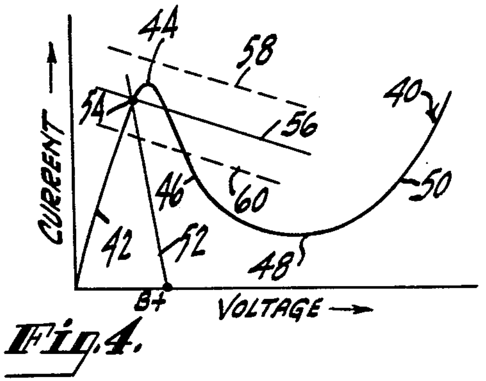
FIGURE 4 is a current-voltage characteristic curve of a tunnel diode which will be referred to in explaining the operation of the circuit of FIGURE 1.

FIGURE 4 shows the current-voltage characteristic curve 40 of a tunnel diode such as the diode 12 in the circuit of FIGURE 1. The characteristic curve 40 includes a low voltage positive resistance region 42, a current peak 44, a negative resistance region 46, a valley 48 and a high voltage positive resistance region 50. The direct current B+ bias applied to the tunnel diode 12 results in a bias line 52 which establishes a quiescent operating point 54 at its intersection with the characteristic curve 40. The slope of the bias line 52 is determined by the resistance of the source and the resistance of the inductor 10.

In addition to the D.C. bias line 52, there is an A.C. bias line 56 passing through the operating point 54 and having a slope determined by the resistance of the circuits in parallel with the tunnel diode 12, namely the signal input and output circuits. The A.C. bias wave causes periodic variations which may be considered as extending on both sides of the A.C. bias line 56 to the limits represented by the dashed lines 58 and 60. The A.C. bias wave may be a sinusoidal wave 62 as represented in FIGURE 2.

In the absence of an input signal pulse, the A.C. bias wave causes the operating point 54 of the tunnel diode to periodically move up and down on the characteristic curve 40. When the A.C. bias wave causes the operating point to move from point 54 up and over the peak 44 on the characteristic curve, the negative resistance region 46 of the diode is encountered, and the diode starts to switch rapidly toward the high voltage positive resistance region 50. However, the diode does not completely switch because the half cycle of the A.C. bias wave ends and is followed by a negative polarity half cycle before the tunnel diode has time to switch. This result flows from the fact that a half cycle of the A.C. bias wave has a duration of the same order of magnitude as the rise time of the tunnel diode. It is thus apparent that the A.C. bias wave does not cause complete switching of the diode.

Figure 5:
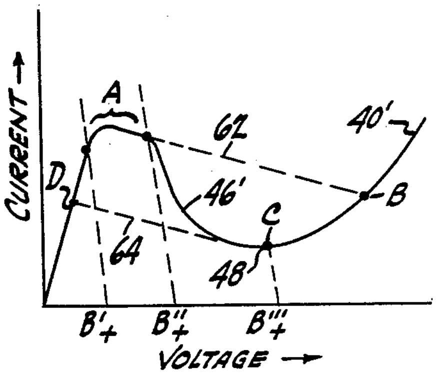
FIGURE 5 is a current-voltage chart illustrating the apparent characteristic of the tunnel diode in the circuit of FIGURE 1 when an A.C. bias is applied in addition to a D.C. bias.

The affect of the A.C. bias wave is such as to cause an apparent modification of the tunnel diode characteristic curve from that shown in FIGURE 4 to that shown in FIGURE 5. The characteristic 40′ shown in FIGURE 5 represents the apparent characteristic as seen from the B+ terminal and neglecting the effect of the shunt input and output resistors 16 and 20. When these resistors are considered, the curve 40′ is tilted so that the portion A is flat, i.e., extends along a constant current line. The modified characteristic is such that the circuit operates reliably with a D.C. bias source having a B+ value anywhere within the range represented as B′+ and B″+. This is to be contrasted with the characteristic illustrated in FIGURE 4 where a slight increase in the B+ voltage causes the operating point 54 to be so close to the peak 44 as to permit the diode to be triggered by noise, and where a smaller B+ voltage causes the operating point 54 to be lower on the positive resistance region 42 with the result that a substantial decrease in the logic gain of the circuit is suffered. It is thus apparent that the addition of A.C. bias to the diode alters its apparent current-voltage characteristic in such a way that the circuit operates reliably and with the desired logic gain even though the values of B+ bias and the values of circuit components depart considerably from the values required for reliable operation without A.C. bias.

The operation of the circuit of FIGURE 1 when an input trigger pulse is applied will now be described with reference to FIGURES 5 and 6 of the drawing. The tunnel diode is biased with D.C. and A.C. biases so that it has a quiescent operating point somewhere in the flat-topped region designated A in FIGURE 5. When a positive input trigger pulse signal from source 14 is applied through resistor 16 to the tunnel diode 12, the operating point of the tunnel diode rapidly switches through the negative resistance region 46′ along the path 62 to the point B on the high voltage positive resistance region of the characteristic curve. Thereafter the operating point moves along the characteristic curve to the point C at a rate determined by the time constant of the circuit including the inductor 10. Then the negative resistance region 46′ is again encountered and the operating point switches along the path 64 to the point D. Thereafter, the operating point moves to the original quiescent point in the flat-topped region designated A.

Figure 6:
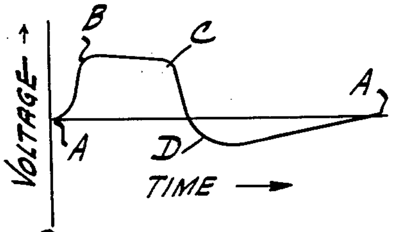
FIGURE 6 illustrates the output voltage waveform provided by the circuit of FIGURE 1 when it is activated by an input signal pulse.

The output voltage wave resulting from the switching process described is as shown in FIGURE 6 wherein the same designations A through D are employed to indicate the time of occurrence of the corresponding operating points in FIGURE 5. The output voltage wave of FIGURE 6 also has some A.C. bias voltage superimposed on it which is not shown in the figure. The shape and duration of the output waveform shown in FIGURE 6 is determined by the values of the circuit elements, and is independent of the shape and duration of the input signal trigger pulse. However, the input signal pulse should have a duration greater than the rise time of the tunnel diode.

The mode of operation of the monostable circuit described above with reference to FIGURE 5 involves D.C. biasing near the peak of the characteristic curve. The invention may also be applied to a monostable circuit which is D.C. biased at a point in the valley 48 of the characteristic curve. This is accomplished by employing D.C. bias source having a value B‴ (FIGURE 5) so that the quiescent operating point is at C. The circuit is triggered by the application of a negative input signal pulse which causes the operating point to move from the point C along the path 64 to the point D, then to a point A and along a path 62 to B, and then return to the quiescent point C. An advantage of operating the diode with D.C. bias in the valley of the characteristic curve is that the circuit recovers more quickly after being triggered than the circuit which is peak biased. The more rapid recovery permits the circuit to be activated in succession at a higher rate.

A presently favored explanation of how the addition of A.C. bias results in reliable operation with relaxed tolerances on the circuit components will now be given. The A. C. bias wave 62 (FIGURE 2) applied to the tunnel diode 12 is partially rectified by the tunnel diode so that the voltage wave actually existing across the tunnel diode has flattened negative half cycles as indicated by the dashed lines 66 (FIG. 2). This partial rectification of the A. C. bias wave results in the generation of a D.C. component represented in FIGURE 2 by the difference 67 between the A.C. axis 68 of the original wave and the A.C. axis 70 of the partially rectified wave. This D.C. component 67 appears at the junction point 18 between the inductor 10 and the tunnel diode 12.

The magnitude of the D.C. component 67 depends on the location of the quiescent operating point 54 (FIGURE 4), which in turn depends on the magnitude of the B+ voltage from the D.C. bias source. If the D.C. bias voltage applied to the B+ terminal of the circuit of FIGURE 1 increases, a larger D.C. component 67 is generated at the junction point 18 as the result of an increased rectification of the A.C. bias wave by the tunnel diode. This increased potential at the junction point 18 follows the increased potential at the terminal B+ and prevents increase of current flow through the inductor 10 and through the tunnel diode 12. Similarly, a decrease in the D.C. bias voltage at terminal B+ results in a decreased D.C. component 67, so that the current flowing through the inductor 10 and the diode 12 is maintained at a substantially constant value. The automatic compensation for changes in the D.C. bias voltage is effective over a considerable range, such as the range between B′+ and B″+ illustrated in FIGURE 5. The effect of the varying rectification of the A.C. bias wave results in an apparent flattening of the peak of the tunnel diode characteristic in the region A of FIGURE 5.

The apparent current-voltage characteristic curve of FIGURE 5 permits not only a relaxation of the tolerances on the D.C. bias source, but also permits a relaxation of the tolerance on the values of other circuits element including the tunnel diode itself. Previously it has been necessary, in order to achieve reliable operation, to specifiy the values of B+ voltage, circuit elements and diode characteristics to within about ±1%. It has been found that circuits constructed according to the invention operate reliably when the tolerances are, for example, ±10%. It has also been found that the amplitude of the A.C. bias wave can vary about ±10% without deterioration of the reliability of operation of the circuit.

For purposes of illustration only, and not by way of limitation, a monostable circuit according to FIGURE 1 which was successfully operated had circuit values as follows:

| | |
|---|---|
| Tunnel diode **12** | Germanium, 5 milliampere peak current, 150 micromicrofarads inherent capacitance, 15 nanoseconds rise time. |
| Inductor **10** | 200 microhenries. |
| Input resistor **16** | 100 ohms. |
| Output resistor **20** | 100 ohms. |
| Input signal pulse **14** | 2 millivolts, 250 nanoseconds pulse width. |
| Capacitor **26** | 5,600 micromicrofarads. |
| Resistor **28** | 680 ohms. |
| A.C. bias source | 13 megacycles, 1.5 volts peak-to-peak. |
| D.C. bias source B+ | 50 millivolts. |

It is apparent that according to the teachings of this invention there is provided an improved stabilized tunnel diode circuit, which by the addition of an A.C. bias wave permits reliable operation of the circuit even though the values of circuit components vary with time or are initially considerably different from the intended values.

What is claimed is:

1. A circuit comprising a negative resistance diode, means to apply an input signal pulse across said diode, means to derive an output signal from across said diode, means to apply a forward direct current bias across said diode, and means to apply an alternating current bias across said diode, said alternating current bias having a frequency such that a half cycle thereof has a duration of the same order of magnitude as the rise time of the diode.

2. A circuit comprising a negative resistance diode, means to apply an input signal pulse to said diode, an inductor connected to said diode for supplying a forward direct current bias to said diode, and a capacitor connected to said diode for supplying an alternating current bias to said diode.

3. A circuit comprising a negative resistance diode, means to apply an input signal to said diode, an inductor connected in series with said diode for supplying a forward direct current bias to said diode, and a capacitor and resistor connected in series with said diode for supplying an alternating current bias to said diode.

4. A monostable circuit comprising a direct current bias source in series with an inductor and a tunnel diode to quiescently bias said diode in a positive resistance region, input means to couple an input signal pulse to said diode to cause the operating point of the diode to switch to the other positive resistance region and back again, output means to derive the resulting output signal pulse from said diode, and means for coupling an alternating current bias source to said diode.

5. A monostable circuit comprising a direct current bias source in series with an inductor and a tunnel diode to quiescently bias said diode in its low voltage positive resistance region, input means to couple an input signal pulse to said diode to cause the operating point of the diode to switch to the high voltage positive resistance region and back again, output means to derive the resulting output signal pulse from said diode, and means for coupling an alternating current bias source across said diode.

6. A monostable circuit comprising a direct current bias source connected in series with an inductor and a tunnel diode to quiescently bias said diode in a positive resistance region of its characteristic curve, input means to couple an input signal pulse to said diode to cause the operating point of the diode to switch to the other positive resistance region and back again, output means to derive the resulting output signal pulse from said diode, and capacitor and resistor means for coupling an alternating current bias source directly to said diode.

7. A monostable circuit comprising a direct current bias source connected in series with an inductor and a tunnel diode connected in series to quiescently bias the diode in a positive resistance region of its characteristic curve, input means to couple an input signal pulse to said diode to cause the operating point of the diode to switch to the other positive resistance region and back again, output means to derive the resulting output signal pulse from said diode, and means for coupling an alternating current bias source across said diode, said alternating current bias source having a frequency such that a half cycle thereof has a duration of the same order of magnitude as the rise time of the tunnel diode.

8. A monostable circulit comprising a direct current bias source connected in series with an inductor and a tunnel diode connected in series to quiescently bias said diode in the valley of its current-voltage characteristic curve, input means to couple an input signal pulse to said diode to cause the operating point of the diode to switch to the low voltage positive resistance region and back again, output means to derive the resulting output signal pulse from said diode, and means for coupling an alternating current bias source across said diode.

References Cited in the file of this patent

UNITED STATES PATENTS

| | | |
|---|---|---|
| 2,843,765 | Aigrain | July 15, 1958 |
| 2,975,377 | Price et al. | Mar. 14, 1961 |
| 2,981,849 | Gobat | Apr. 25, 1961 |
| 3,105,957 | Li | Oct. 1, 1963 |
| 3,108,233 | Wasson et al. | Oct. 22, 1963 |

OTHER REFERENCES

Article: "The Tunnel Diode As a Logic Element," by Lewin et al., in 1960, International Solid-State Circuits Conference, Feb. 10, 1960, pages 10–11.